US008717816B2

(12) United States Patent
Yano (10) Patent No.: US 8,717,816 B2
(45) Date of Patent: May 6, 2014

(54) SEMICONDUCTOR MEMORY DEVICE

(75) Inventor: Masaru Yano, Tokyo (JP)

(73) Assignee: Windbond Electronics Corp., Taichung (TW)

( * ) Notice: Subject to any disclaimer, the term of this patent is extended or adjusted under 35 U.S.C. 154(b) by 196 days.

(21) Appl. No.: 13/404,710

(22) Filed: Feb. 24, 2012

(65) Prior Publication Data

US 2013/0077413 A1 Mar. 28, 2013

(30) Foreign Application Priority Data

Sep. 28, 2011 (JP) .................................. 2011-213086

(51) Int. Cl.
*G11C 11/34* (2006.01)

(52) U.S. Cl.
USPC ............ 365/185.11; 365/185.12; 365/185.17; 365/185.18; 365/185.23; 365/185.33

(58) Field of Classification Search
USPC ............ 365/185.11, 185.12, 185.17, 185.18, 365/185.23, 185.33, 230.03, 230.06
See application file for complete search history.

(56) References Cited

U.S. PATENT DOCUMENTS

| 6,044,017 | A | * | 3/2000 | Lee et al. | 365/185.11 |
|---|---|---|---|---|---|
| 6,118,723 | A | * | 9/2000 | Agata et al. | 365/230.03 |
| 6,542,432 | B2 | * | 4/2003 | Sim | 365/230.06 |
| 6,549,461 | B2 | * | 4/2003 | Park et al. | 365/185.17 |
| 7,289,387 | B2 | * | 10/2007 | Lee et al. | 365/230.06 |
| 7,366,038 | B2 | * | 4/2008 | Jung et al. | 365/230.06 |
| 7,545,701 | B2 | * | 6/2009 | Min et al. | 365/230.03 |
| 7,692,942 | B2 | | 4/2010 | Oosaka | |
| 7,911,850 | B2 | * | 3/2011 | Chae et al. | 365/185.17 |
| 8,446,770 | B2 | * | 5/2013 | Oh et al. | 365/185.17 |
| 2006/0083062 | A1 | | 4/2006 | Park | |

FOREIGN PATENT DOCUMENTS

| JP | 2000285690 | 10/2000 |
|---|---|---|
| JP | 2002197882 | 7/2002 |
| JP | 2006107690 | 4/2006 |
| JP | 2006107701 | 4/2006 |
| JP | 2007-157834 A | 6/2007 |
| KR | 10-0609576 B1 | 8/2006 |

OTHER PUBLICATIONS

Korean Office Action for Korean Application No. 10-2012-0032476 dated Aug. 5, 2013 with English Translation.

\* cited by examiner

*Primary Examiner* — Trong Phan (74) *Attorney, Agent, or Firm* — Muncy, Geissler, Olds & Lowe, P.C.

(57) ABSTRACT

A flash memory 100 capable of reducing electric fields applied to the word lines on a memory array and reducing a chip area, includes a memory array 110, a word line decoder 120 disposed at an end of the memory array on the row direction, selecting a predetermined memory block in the memory array according to an address signal, and outputting a selecting signal to the selected memory block, and a word line drive circuit 130 comprising a switch circuit arranged between the memory arrays 110A and 110B and switching the application of the work voltage to a memory cell according to the selecting signal, and a pump circuit raising the voltage level of the selecting signal. The word line decoder 120 has lines WR(i) to transmit the selecting signals. The lines WR(i) are connected to the switch circuit of the word line drive circuit 130.

8 Claims, 8 Drawing Sheets

SEMICONDUCTOR MEMORY DEVICE

CROSS REFERENCE TO RELATED APPLICATIONS

This Application claims priority of Japanese Patent Application No. 2011-213086, filed on Sep. 28, 2011, the entirety of which is incorporated by reference herein.

BACKGROUND OF THE INVENTION

1. Field of the Invention

The present invention relates to a semiconductor memory device, and in particular relates to a driving method for word lines of an NAND type flash memory.

2. Description of the Related Art

As a storage device, flash memories can be widely used in electronic devices, such as digital cameras or smart phones. In satisfaction of the market demand, the flash memory must satisfy needs of: small scale, large capacity, high access speed, and low power consumption, etc.

A NAND type flash memory comprises a memory block array where a plurality of NAND strings are arranged in the row or column direction. The NAND string comprises a plurality of memory cells connected in series and two selecting transistors respectively connected to the two ends of the series connection of the memory cells.

Typically, when a memory is written with data, the P-well, drain, and source, of the memory cell substrate, are applied with 0V, and the control gate is applied with a high writing voltage (for example 20V). When a delete operation is performed, the control gate is applied with 0V, and the P-well is applied with a high voltage (for example 20V) to delete the data of at least one memory block. When a read operation is performed, the control gate of the selected memory cell is applied with 0V, and the control gates of the other memory cells are applied with a voltage Vread which is higher than the power voltage Vcc. Therefore, several voltages higher than the power voltage Vcc should be generated in the operation of the flash memory, and then applied to the memory cells via the word lines.

One of the methods to raise voltage is by using a charge pump. When a word line decoder is provided with the charge pump, the scale of the word line decoder will increase substantially because of capacitors. To solve this problem, Patent document 1 discloses a word line decoder which reduces its layout scale by removing a charge pump. The word line decoder can self boost the voltage level of a word line enable signal to enable a word line, and restrain the voltage level of the word line enable signal from lowering down.

In addition, when a charge pump is used to raise the voltage level of the program voltage Vpgm or Vread, threshold voltages of NMOS transistors increase because of body effect, and this results in difficulty to sufficiently raise voltages. The word line decoder disclosed in Patent document 2 is used to solve the above problem. The word line decoder disclosed in Patent document 2 applies voltages to the gate and the drain of a pass-transistor connected to the word line at different timings. Thus, self-boost of the pass-transistor is used to avoid the lowering down of operation voltages while reducing circuit scale.

[Patent document 1] Japan patent application publication 2002-197882
[Patent document 2] Japan patent application publication 2006-107701

Figure 1A:
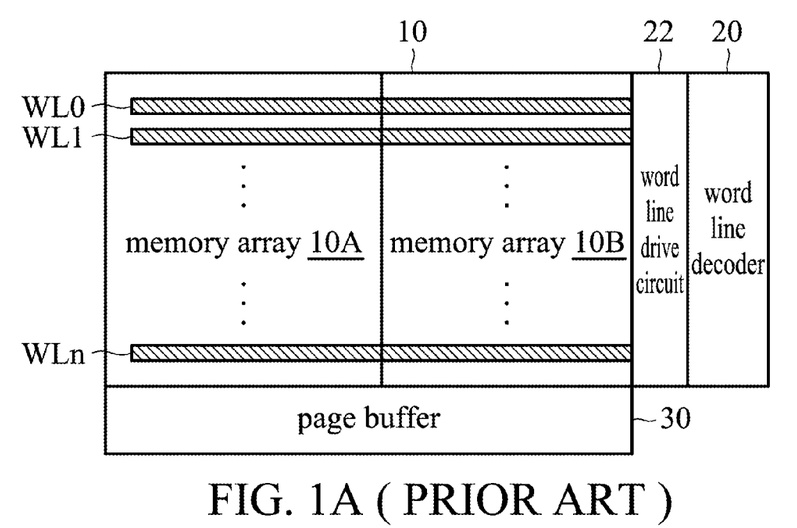
FIG. 1A shows a layout of a conventional flash memory.

However, there are still problems for the word line decoder of a conventional flash memory which are as follows. FIG. 1A shows a layout of the word line decoder of a conventional flash memory. In the row direction, one end of the memory array is arranged with a word line decoder, a level shifter (both of them are called as a word line decoder 20 thereafter), and a word line drive circuit 22. In the column direction, one end of the memory array is arranged with a page buffer 30. In this example, the memory array 10 is divided into 2 memory arrays. The word line decoder 20 provides the required operation voltages to a selected word line and unselected word lines according to an address signal. The operation voltages include a program voltage Vpgm, applied to the selected word line during a writing operation, a pass voltage, applied to the unselected word lines during the writing operation, a ground voltage, applied to the selected word line a during reading operation, and a reading voltage, applied to the unselected word line the during reading operation.

The word line drive circuit 22 comprises a pass transistor for transmitting an operation voltage from the word line decoder 20 to the gate of a memory cell. The operation voltage is applied to the memory cell by turning on the pass transistor. The word line drive circuit 22 applies a high voltage to the gate of the pass transistor to restrain the operation voltage from lowering down.

As shown in FIG. 1A, the word lines WL0, WL1 ... WLn connected to the word line drive circuit 22 must be arranged across the memory array 10 in the row direction. The word line should be applied with a high program voltage Vpgm (for example, 20V) during a writing operation. If the resistance capacity (RC) of the word line increases, the voltage will take more time to arrive at the end of the word line. In addition, in order to provide the program voltage Vpgm to the memory cell at the end of the word line, a high program voltage Vpgm should be applied to the word line, and this increases power consumption substantially. Moreover, if the width of the word line is wide enough to reduce the wire resistance thereof, it is hard for the memory array to be minimized.

On the other hand, the pass transistor of the word line drive circuit 22 is constructed by an N-MOS transistor. To restrain from lowering down of the threshold value of the program voltage Vpgm, the gate of the pass transistor must be applied with a voltage higher than the program voltage Vpgm. Therefore, in order to raise the withstand voltage of the gate oxide layer, the thickness of gate oxide layer must be increased (for example, 400 Å), and this increases the size of the transistor and also the circuit area of the word line drive circuit 22. Furthermore, if the word line drive circuits 22 are arranged with a narrow pitch therebetween, latch-up will easily occur between adjacent pass transistors. In this regard, an appropriate pitch should be kept between the pass transistors, but such arrangement would increase the chip area.

Figure 1B:
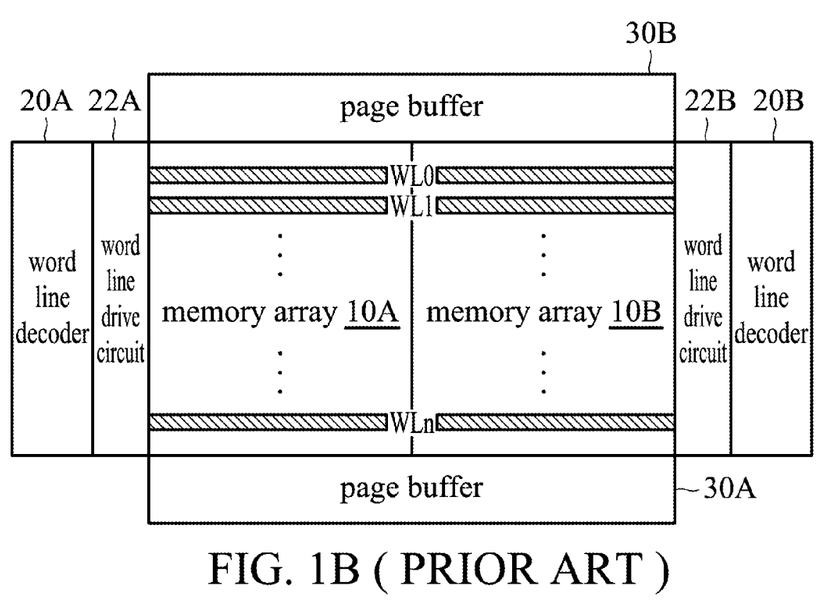
FIG. 1B shows another layout of a conventional flash memory.

FIG. 1B shows another layout of a conventional flash memory. In this example, word line decoders 20A and 20B and word line drive circuits 22A and 22B are arranged at the left end and the right end of the memory array. The word line decoders 20A and the word line drive circuit 22A work for the memory array 10A, and the word line decoders 20B and the word line drive circuit 22B work for the memory array 10B. The page buffer 30A below the memory arrays 10A and 10B performs data reading or writing for odd bit lines, and the page buffer 30B above the memory arrays 10A and 10B performs data reading or writing for even bit lines As shown in FIG. 1B, though the wire lengths of the word lines WL0, WL1 ... WLn in the row direction can be reduced to be a half of that shown in FIG. 1A, a word line decoder and a word line drive circuit should be arranged at both the two ends of the memory array, such that the chip area is increased.

The purpose of the invention is to solve the problem on the conventional art, and provide a semiconductor memory device capable of reducing the electric fields applied to the word lines on the memory arrays and also reducing the area of the chip including the memory arrays and the peripheral circuits.

BRIEF SUMMARY OF THE INVENTION

A detailed description is given in the following embodiments with reference to the accompanying drawings.

A semiconductor memory device of the present invention, includes: a memory array constructed by a plurality of cell units, wherein the cell unit is formed by electrically rewritable memory cells connected in series; a word line decoder selecting a specific memory block within the memory array and outputting a selecting signal to the selected memory block according to an address signal; and a word line drive circuit including a switch circuit switching operation voltages to be supplied to the memory cells according to the selecting signal, and a voltage booster circuit boosting the voltage level of the selecting signal, wherein the switch circuit includes at least one transistor self-boosting the voltage level of the selecting signal according to the operation voltage.

In the semiconductor memory device in accordance with a preferred embodiment, the switch circuit includes a plurality of pass transistors for transmitting the operation voltages to the gates of the memory cells, wherein the gates of the plurality of pass transistors are supplied with the selecting signal and the plurality of pass transistors self-boost the voltage level of the selecting signal according to the operation voltages. The word line drive circuit is arranged between a first memory array and a second memory array extending in the row direction, and the word line drive circuit is common for the first memory array and the second memory array.

In the semiconductor memory device in accordance with a preferred embodiment, the voltage booster circuit includes a node where the voltage level is pre-charged to be higher than the power voltage, and a voltage booster transistor of which the gate is connected to the node, wherein the voltage booster transistor boosts the voltage level at the node according to the selecting signal supplied to the drain thereof. The word line decoder includes a voltage booster circuit for supplying the selecting signal, wherein the voltage level is boosted to be higher than the power voltage to the word line drive circuit. The word line decoder includes a drive circuit for driving a bit line selecting transistor and a source selecting transistor of the cell unit.

In the semiconductor memory device in accordance with a preferred embodiment, the memory array is divided into two divided memory arrays, wherein the word line drive circuit is arranged between the two divided memory arrays, and the word line decoder is arranged at an end of the memory array, and wherein the word line decoder comprises a wire layer for transmitting the selecting signal, wherein the wire layer extends from the word line decoder to the word line drive circuit in the manner of crossing one of the two divided memory arrays in the row direction. The word line extends from the word line drive circuit to respective divided memory array.

According to the invention, the voltage level of the selecting signal for the word line drive circuit is raised by self-boost of the transistor. In comparison with the prior art, the voltage applied to the transistor can be reduced and the scale of the transistor can also be reduced. Furthermore, in comparison with the prior art, a voltage booster circuit, such as a charge pump is not necessary by utilizing self-boost, and thus the layout scale of the word line drive circuit or the word line decoder can be reduced. Moreover, it is not necessary to boost the selecting signal in consideration of the body effect due to boosting electric charges. In addition, the word line drive circuit can be arranged between the memory arrays in the row direction to reduce the length of the wires extended from the word line drive circuit to reduce load of the wires. The influence of the electric field of the selecting signal on the memory array is also reduced.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Now, embodiments of the invention are described with reference to the drawings. The preferred embodiment of the invention takes a NAND type flash memory as an example. In the drawings, for easy understanding and emphasis, the scale of each part of the memory may be different from that of the practical memory device.

Figure 2:
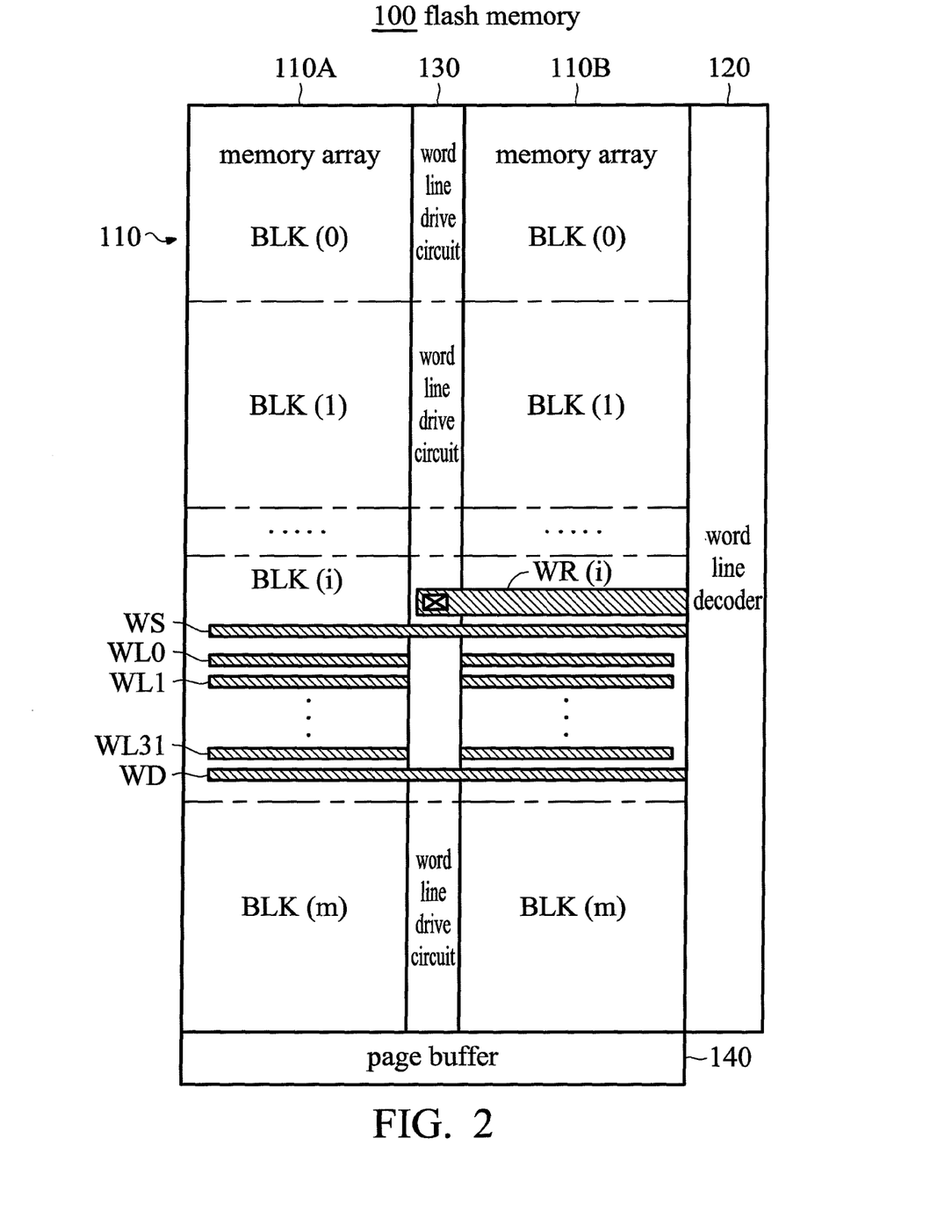
FIG. 2 shows a layout of a flash memory in accordance of an embodiment of the invention.

FIG. 2 shows a layout of a flash memory in accordance of an embodiment of the invention. As shown in FIG. 2, the flash memory 100 comprises a memory array 110 divided into at least 2 memory arrays 110A and 110B, a word line decoder and a level shifter (both of them are called as a word line decoder 120 thereafter) arranged at an end of the memory array 110 in the row direction, a word line drive circuit 130 arranged between the memory arrays 110A and 110B, and page buffers 140 arranged in the column direction of the memory array 110 and having sense amplifiers sensing the data read from bit lines or holding the writing data. The word lines WL0, WL1 . . . WLn connected to the word line drive circuit 130 are extended on the memory array 110A and 110B in the row direction. Note that although not shown in FIG. 2, the flash memory 100 further comprises an input/output buffer transmitting/receiving data to/from external devices, and a controller controlling each part of the flash memory 100 according to the command from the external devices, and etc.

Figure 4:
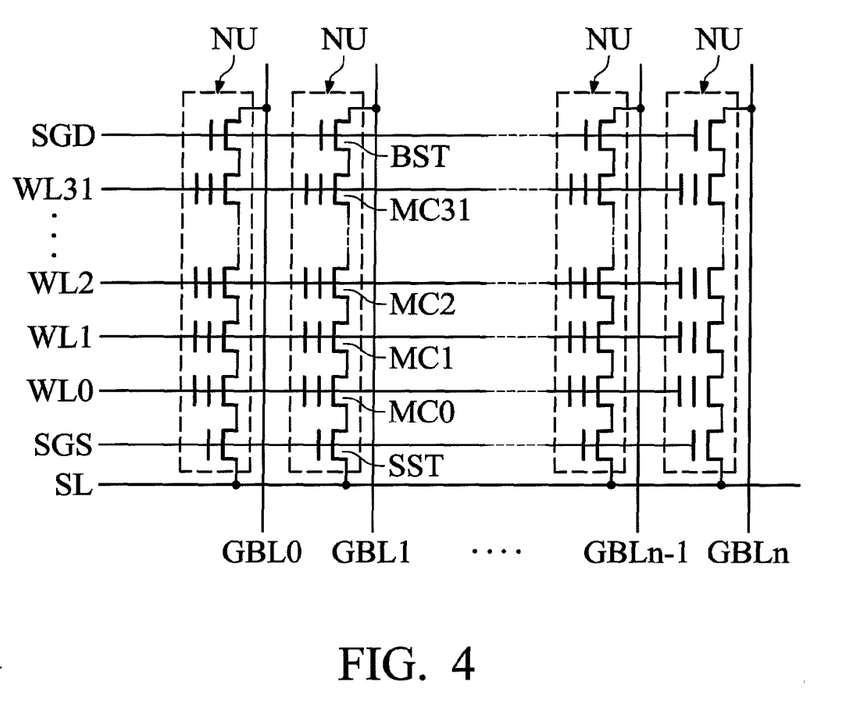
FIG. 4 shows a circuit diagram of NAND strings formed within the memory block.

The memory arrays 110A and 110B are divided into a plurality of memory blocks BLK(0), BLK(1), . . . , and BLK(m) in the column direction, wherein each memory block is constructed by several pages. FIG. 4 shows a circuit diagram of NAND strings formed within the memory block. At the first page, a plurality of memory cells are connected in series in the column direction to form an NAND string (a cell unit NU is called hereafter). In the example shown in FIG. 4, a cell unit NU comprises 32 memory cells MCi (i=0, 1, . . . , 31), a bit line selecting transistor BST, and a source selecting transistor SST. The bit line selecting transistor BST and the source selecting transistor SST are respectively connected to the two ends. The drain of the bit line selecting transistor BST is connected to a corresponding bit line (GBL0, GBL1 . . . GBLn−1, or GBLn), and the source of the source selecting transistor SST is connected to a common source line SL. The control gate of the memory cell MCi is connected to a corresponding word line WLi (i=0, 1 . . . , 31). The gates of the bit line selecting transistor BST and the source selecting transistor SST are respectively connected to gate lines SGD and SGS, which are parallel with the word lines WL0, WL1, WL2 . . . WL31.

Typically, the memory cell has a MOS structure comprising a source/drain of N type diffusion area, a tunnel-oxide layer formed on the tunnel between the source and the source, a floating gate formed on the tunnel-oxide layer, a dielectric layer formed on the floating gate, and a control gate formed on the dielectric layer. Commonly speaking, when the floating gate is accumulated with no electric charges, namely, data "1" is written, the threshold voltage is negative, and the memory cell is normally on. When the floating gate is accumulated with electric charges, namely, data "0" is written, the threshold voltage is shifted to be positive, and the memory cell is normally off.

Figure 3:
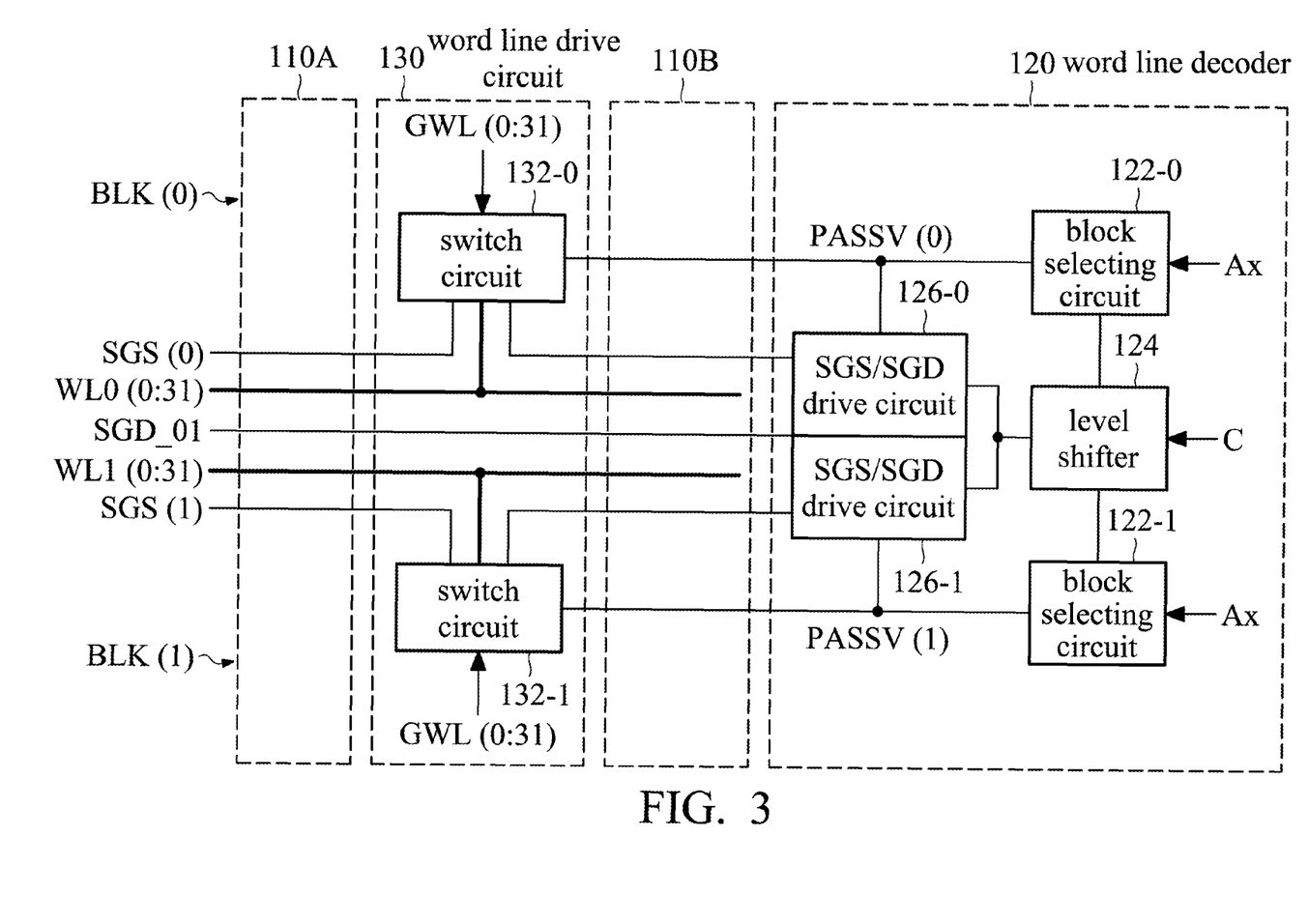
FIG. 3 shows a block diagram of the word line decoder and the word line drive circuit.

FIG. 3 shows a block diagram of the word line decoder 120 and the word line drive circuit 130. For convenience for description, assume that a memory block is constructed by a left page and a right page (2 pages in total) of the memory arrays 110A and 110B. FIG. 3 shows two adjacent memory blocks BLK(0) and BLK(1).

The word line decoder 120 comprises block selecting circuits 122-0 and 122-1 selecting a memory block according to an address signal Ax, a level shifter 124 generating necessary operation voltages according to a control signal C from a controller (not shown in FIG. 3), and SGS/SGD drive circuits 126-0 and 126-1 connected to the gates of the bit line selecting transistor BST and the source selecting transistor SST and supplying gate selecting signals SGS/SGD including SGS(0), SGS(1), and SGD_01 shown in FIG. 3.

According to the address signal Ax and the control signal C, the word line decoder 120 uses the level shifter 124 to generate an operation voltage GWL(0:31) to a corresponding word line WL0(0:31) or WL1(0:31). Namely, when data is written, the program voltage Vpgm (for example, 20V) is applied to a selected word line and a pass voltage (for example, 10V) is applied to unselected word lines. When a read operation is performed, a ground level voltage is applied to the selected word line and a read voltage Vread (for example, 4.5V) is applied to the unselected word lines The block selecting circuits 122-0 transmits a selecting signal PASSV(0) to the switch circuit 132-0 of the word line drive circuit 130 when the memory block BLK(0) is selected. The selecting signal PASSV(0) has a voltage level (for example, 10V) which is raised by the level shifter 24 to be higher than the power voltage Vcc. The SGS/SGD drive circuit 126-0 supplies gate selecting signals SGS/SGD which is raised to about 5~6V to the bit line selecting transistor BST and the source selecting transistor SST of the memory block BLK(0). Similarly, when the memory block BLK(1) is selected, the block selecting circuits 122-1 transmits a selecting signal PASSV(1) to the switch circuit 132-1 of the word line drive circuit 130. The SGS/SGD drive circuit 126-1 supplies gate selecting signals SGS/SGD, which are raised to about 5~6V, to the bit line selecting transistor BST and the source selecting transistor SST of the memory block BLK(1). As shown in FIG. 3, the gate selecting signal SGD_01 transmitted by the SGS/SGD drive circuits 126-0 and 126-1 to the bit line selecting transistor BST is common Here, referring to FIG. 2, a wire layout of the bit line decoder 120 and the bit line drive circuit 130(i) of the i-th memory block is taken as an example. The i-th block selecting circuit 120-i of the word line decoder 120 is connected to the switch circuit 132-i of the word line drive circuit 130 via a metal wire WR(i) which extends across the memory array 110B. The metal wire WR(i) is used to transmit the selecting signal PASSV(i). The metal wire WD/WS which extends across the memory arrays 110A and 110B in the row direction is used to transmit the gate selecting signal SGD/SGS from the SGS/SGD drive circuit 126-i. Note that the metal wire WD/WS extends across the entire memory array 110 in the row direction and does not contact the word line drive circuit 130.

Figure 5:
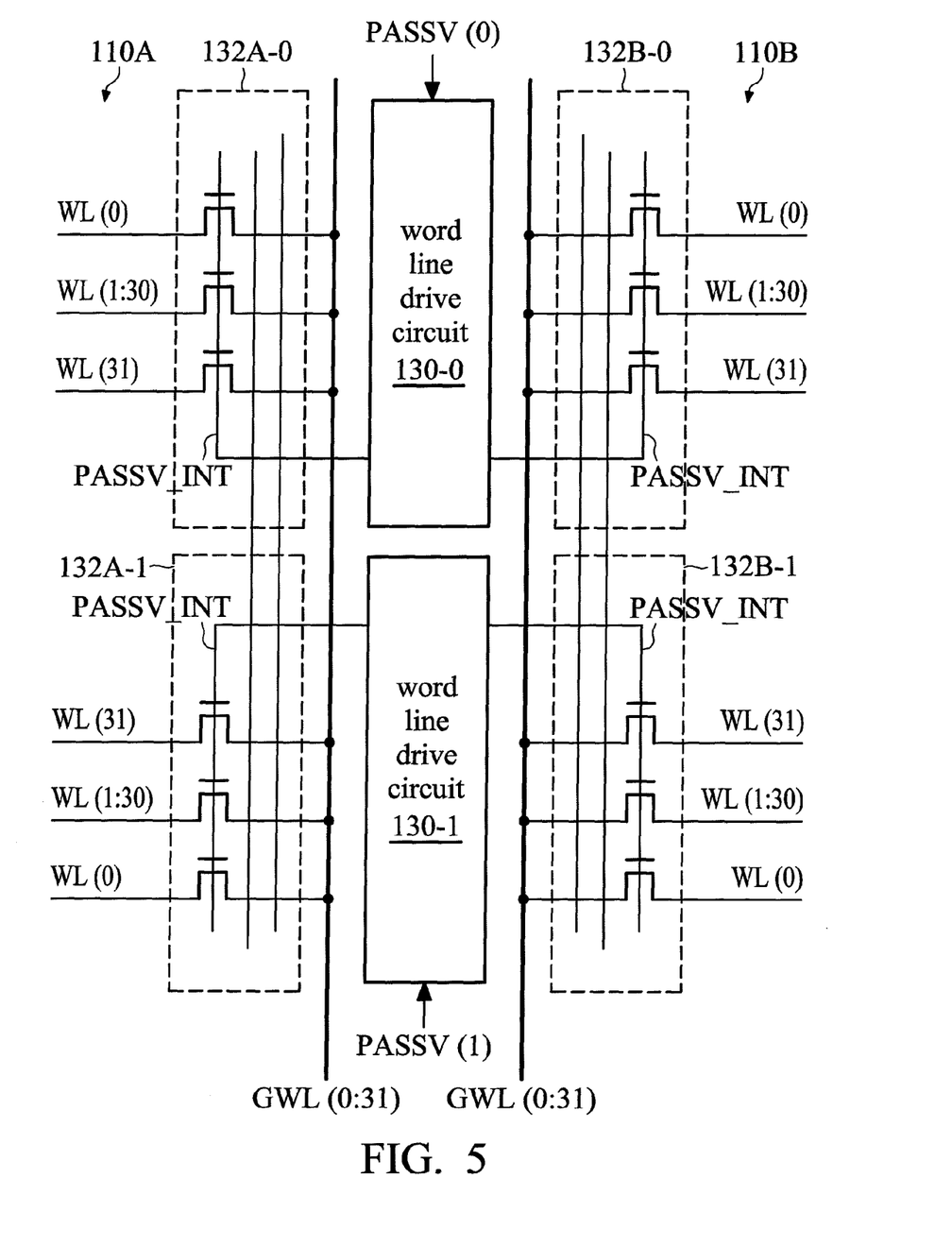
FIG. 5 shows a structure diagram of the switch circuit of the word line driving circuit.

FIG. 5 shows a structure diagram of the switch circuit of the word line driving circuit. As shown in FIG. 5, a switch circuit 132A-0 connected to the memory array 110A is formed at the left side of the word line drive circuit 130-0, and a switch circuit 132B-0 connected to the memory array 110B is formed at the right side of the word line drive circuit 130-0. Similarly, a switch circuit 132A-1 is formed at the left side of the word line drive circuit 130-1, and a switch circuit 132B-1 is formed at the right side of the word line drive circuit 130-1. The switch circuits 132A-0, 132B-0, 132A-1, and 132B-1 have the same structure, so only the switch circuit 132A-0 is described.

The switch circuit 132A-0 comprises a plurality of N-channel pass transistors connected to the word lines WL(0)~WL(31) (for simplification the word lines WL(1)~WL(30) are represented by one word line WL(1:30) in FIG. 5) of the cell unit NU. The gates of these pass transistors are commonly supplied with a selecting signal PASSV_INT from the word line drive circuit 130-0. The selecting signal PASSV_INT is generated according to the selecting signal PASSV of the word line decoder 120. Therefore, when the memory block is selected, the selecting signal PASSV_INT has a voltage level capable of fully conducting the pass transistors such that the operation voltages GWL(0:31) from the word line decoder 120 can be transmitted to the corresponding word lines WL(0:31). On the other hand, when the memory block is not selected, the selecting signal PASSV has a non-activating voltage level (L voltage level) such that the selecting signal PASSV_INT also has a non-activating voltage level and the pass transistors are not conducted.

Figure 6:
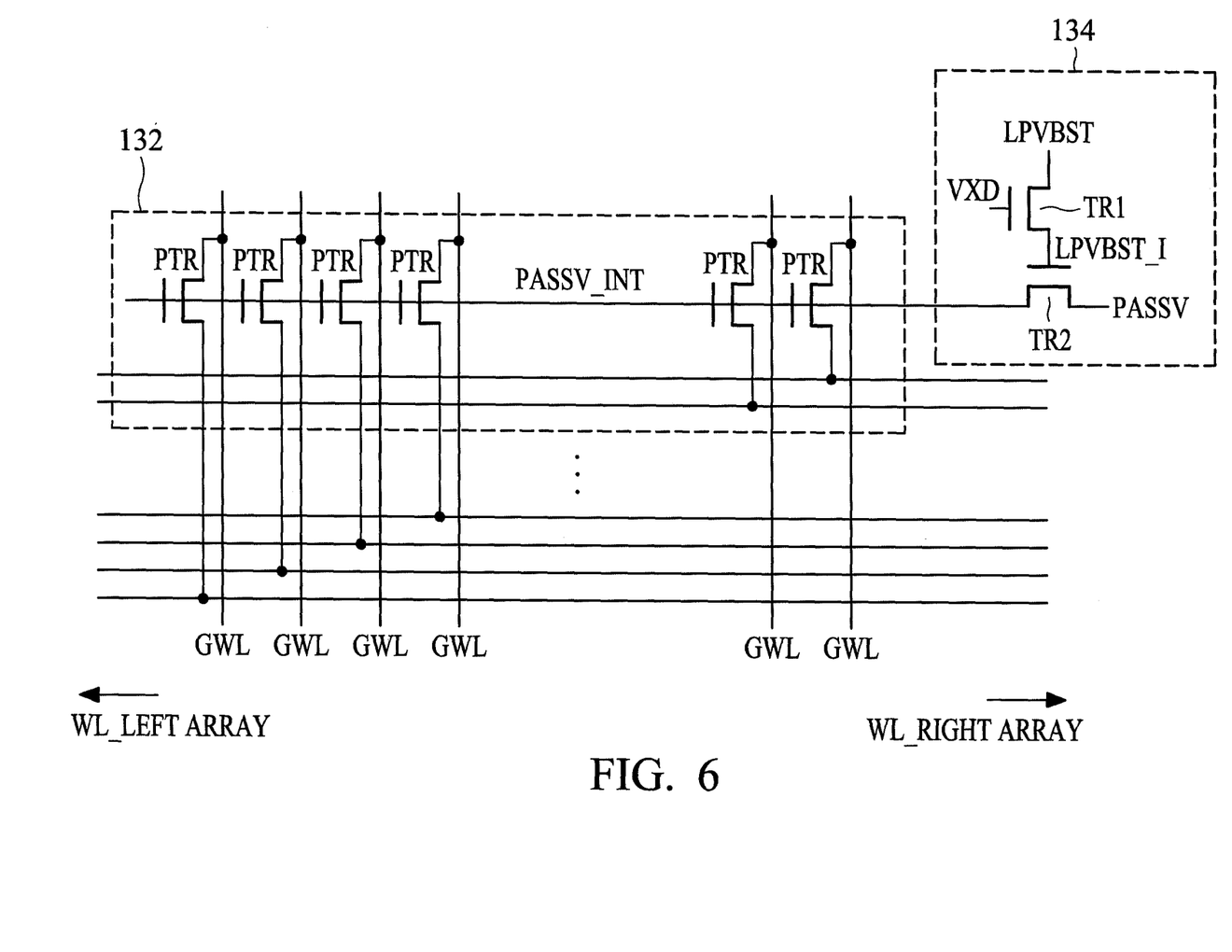
FIG. 6 shows a circuit diagram of the word line drive circuit.

FIG. 6 shows a circuit diagram of the word line drive circuit 130. The word line drive circuit 130 comprises a switch circuit 132 switched by the signal PASSV_INT and a voltage booster circuit 134 raising the voltage at a node according to the selecting signal PASSV. The voltage booster circuit 134 comprises an N-channel first transistor TR1 with a high withstand voltage, and an N-channel second transistor TR2 with a high withstand voltage, of which the gate is connected to the N-channel first transistor TR1. In operation, the gate of the first transistor TR1 receives a signal VXD having a boosted voltage level Vp which is higher than the power voltage Vcc (for example, 3V). When the drain is applied with a signal LPVBST having the same voltage level Vp, a voltage level Vp−Vt (Vt is the threshold voltage of the first transistor TR1) will be generated at the node LPVBST_1 connected to the source.

Regarding the second transistor TR2, the gate is connected to the node LPVBST_1, the drain is supplied with a selecting signal PASSV from the word line decoder 120, and the source is connected to the gates of the transistors PTR of the switch circuit 132. When the voltage level Vp−Vt is generated at the node LPVBST_1 and the drain of the second transistor TR2 is applied with the selecting signal having voltage level high than Vp−Vt, self-boost will happens at the node LPVBST_1 by the capacitive coupling between the gate and the drain of the second transistor TR2. The second transistor is then conducted because of the self-boosted gate voltage. Accordingly, the selecting signal PASSV_INT can be generated without lowering down the voltage level of the selecting signal PASSV.

In the switch circuit, the gate of each pass transistor PTR is applied with the selecting signal PASSV_INT. When the drain of the pass transistor PTR is applied with an operation voltage GWL (for example, a program voltage Vpgm), the selecting signal PASSV_INT applied to the gate of the pass transistor PTR will be self-boosted. Therefore, lowering down of voltage due to the pass transistor PTR can be avoided and the operation voltage can be transmitted to the corresponding word line (including the portion of the word line arranged in the left array WL_LEFT ARRAY and the portion of the word line arranged in the right array WL_RIGHT ARRAY).

Figure 7:
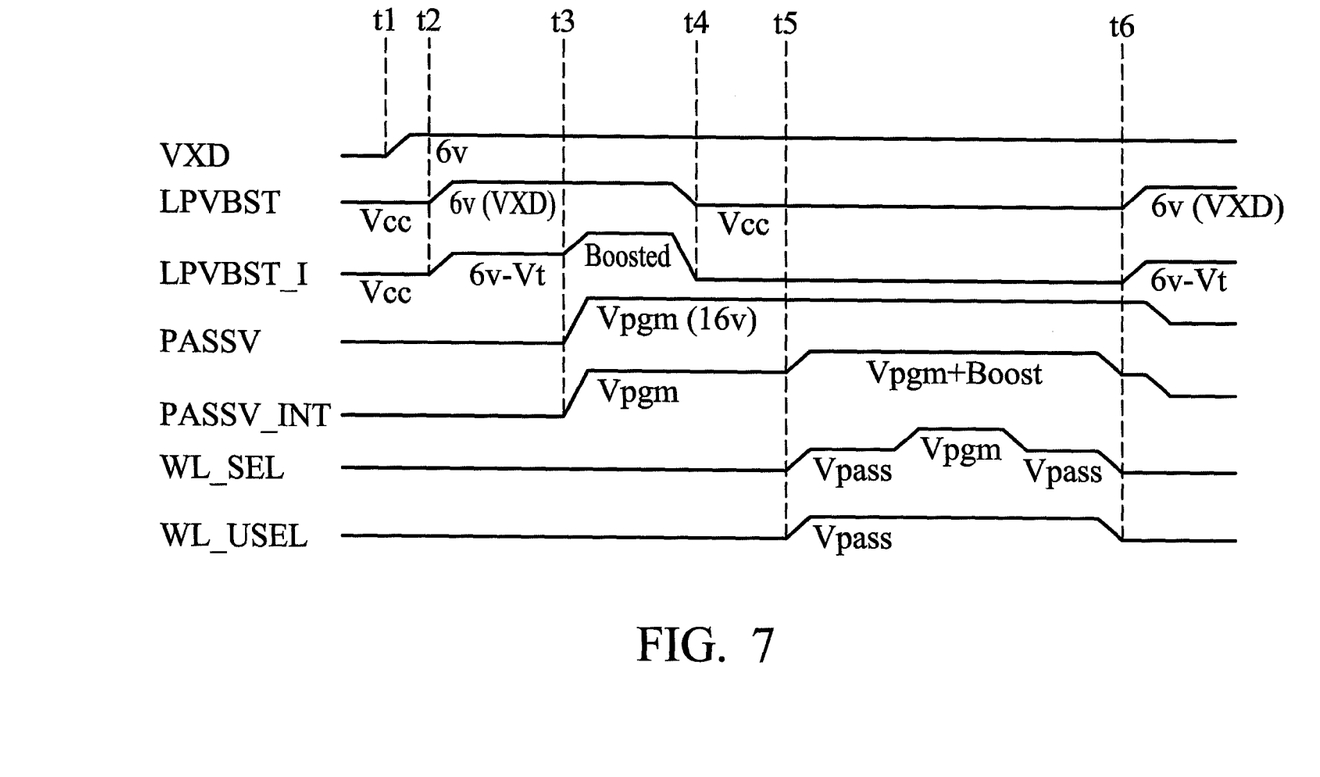
FIG. 7 shows a timing chart of the writing operation of the word line drive circuit in accordance with the embodiment.

FIG. 7 shows a timing chart of the writing operation of the word line drive circuit in accordance with the embodiment. First, at timing t1, the gate of the first transistor TR1 is applied with a signal VXD which has been boosted to, for example, 6V. Following, at timing t2, the drain of the first transistor TR1 is applied with a signal LPVBST which has been boosted to, for example, 6V, such that the node LPVBST_1 is precharged to 6V−Vt. Next, at timing t3, the drain of the second transistor TR2 is applied with a program voltage Vpgm (for example, 16V) as a selecting signal PASSV, and the node LPVBST_1 is self-boosted (6V−Vt+Boost). Therefore, without lowering down the program voltage Vpgm, the voltage booster circuit 134 can supply a selecting signal PASSV_INT which has voltage level equal to the program voltage Vpgm to the switch circuit 132.

Next, at timing t4, by lowering down the signal LPVBST to the voltage level Vcc, the voltage level at the node LPVBST_1 is discharged via the first transistor TR1 to the voltage level Vcc. Following, at timing t5, the operation voltage GWL is applied to the drain of the pass transistor PTR. Namely, a selected word line WL_SEL is applied with a pass voltage Vpass and the program voltage Vpgm in sequence, and unselected word line WL_USEL is applied with the pass voltage Vpass. The pass voltage is, for example, 10V. According to the operation voltage GWL applied to the pass transistors PTR, the selecting signal PASSV_INT is self-boosted to Vpgm+Boost. Therefore, the pass transistors PTR are conducted strongly and the operation voltage GWL is transmitted to the corresponding word line. After this operation, the next operation is performed in the same way. Note that in the reading operation the unselected word lines are supplied with a reading voltage (for example, 4.5V) higher than the power voltage Vcc, but the operation is still performed in the same way.

According to the embodiment, the selecting signal PASSV_INT from the voltage booster circuit 134 is applied to the gate of the pass transistor PTR and the operation voltage GWL is applied to the drain of the pass transistor. In this way, capacity coupling between the gate and the drain/source is utilized to self-boost the selecting signal PASSV_INT. Therefore, the voltage applied to the pass transistors PTR in the embodiment can be reduced to be lower than the high voltages applied to the gate and the source of selecting transistor without utilizing self-boost in the prior art. The pass transistors PTR can also be reduced such that the circuit area of the switch circuit 132 is reduced. In addition, the boost voltage applied to the word line can be lowed down more than the prior art does.

In the above embodiment, one word line decoder 120 is arranged for all memory blocks BLK(0) . . . BLK(m) of the memory arrays 110, but it is also possible to arrange a plurality of word line decoders for memory blocks BLK(0) . . . BLK(m). In this situation, a specified word line decoder can be selected out from all word line decoders according to the address signal.

Figure 8A:
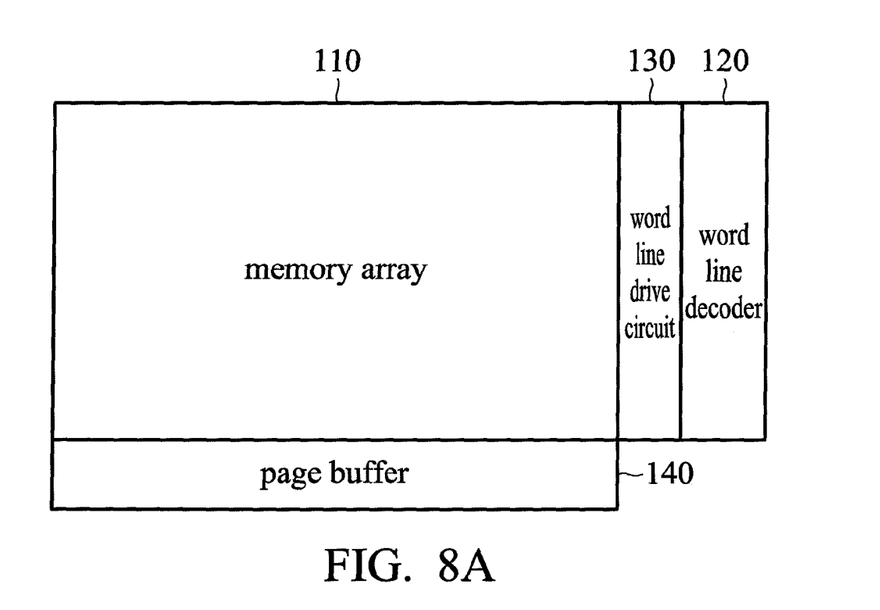
FIG. 8A shows another layout of the word line drive circuit in accordance of an embodiment of the invention.
Figure 8B:
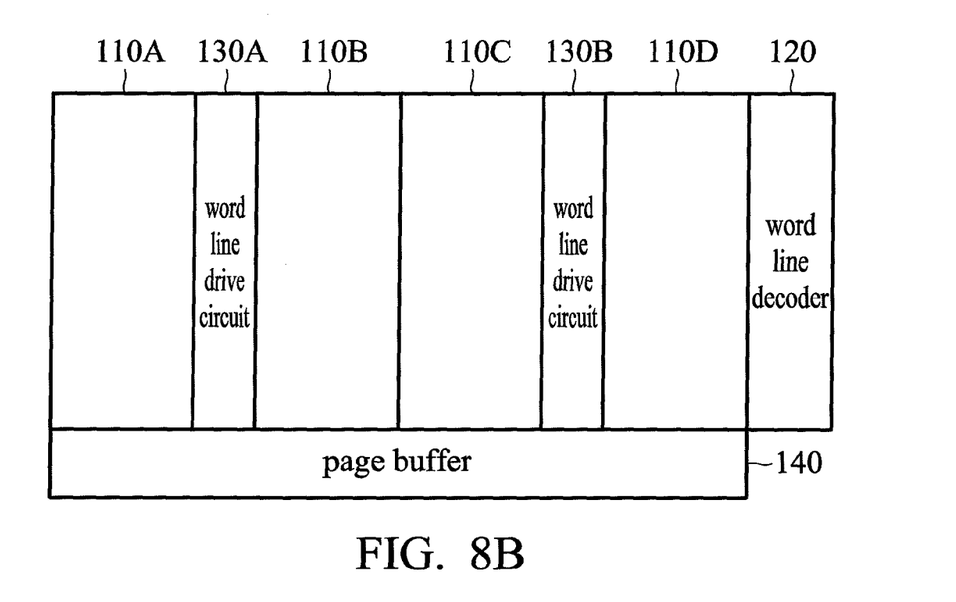
FIG. 8B shows another layout of the word line drive circuit in accordance of an embodiment of the invention.

In the above embodiment, the word line decoder 120 is arranged between two memory arrays 110A and 110B in the row direction, but the arrangement is not limited thereto. As shown in FIG. 8A, the word line decoder 130 is arranged to an end of the memory array 110. As shown in FIG. 8B, a memory array 110 is divided to 4 memory arrays 110A, 110B, 110C, and 110D, and two word line drive circuits 130A and 130B are arranged between adjacent memory arrays in the row direction.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device, comprising
a memory array constructed by a plurality of cell units, wherein the cell unit is formed by electrically rewritable memory cells connected in series;
a word line decoder selecting a specific memory block within the memory array and outputting a selecting signal to the selected memory block according to an address signal; and
a word line drive circuit comprising a switch circuit, switching operation voltages to be supplied to the memory cells according to the selecting signal, and a voltage booster circuit boosting the voltage level of the selecting signal,
wherein the switch circuit comprises at least one transistor self-boosting the voltage level of the selecting signal according to the operation voltage.

2. The semiconductor memory device as claimed in claim 1, wherein the switch circuit comprises a plurality of pass transistors for transmitting the operation voltages to the gates of the memory cells, wherein the gates of the plurality of pass transistors are supplied with the selecting signal and the plurality of pass transistors self-boost the voltage level of the selecting signal according to the operation voltages.

3. The semiconductor memory device as claimed in claim 1, wherein the word line drive circuit is arranged between a first memory array and a second memory array extending in the row direction, and the word line drive circuit is common for the first memory array and the second memory array.

4. The semiconductor memory device as claimed in one of claim 1, wherein the voltage booster circuit comprises a node where the voltage level is pre-charged to be higher than the power voltage, and a voltage booster transistor having a gate connected to the node, wherein the voltage booster transistor boosts the voltage level at the node according to the selecting signal supplied to the drain thereof.

5. The semiconductor memory device as claimed in one of claim 1, wherein the word line decoder comprises a voltage booster circuit for supplying the selecting signal, of which the voltage level is boosted to be higher than the power voltage, to the word line drive circuit.

6. The semiconductor memory device as claimed in one of claim 1, wherein the word line decoder comprises a drive circuit for driving a bit line selecting transistor and a source selecting transistor of the cell unit.

7. The semiconductor memory device as claimed in one of claim 1, wherein the memory array is divided into two divided memory arrays, wherein the word line drive circuit is arranged between the two divided memory arrays, and the word line decoder is arranged at an end of the memory array, and wherein the word line decoder comprises a wire layer for transmitting the selecting signal, wherein the wire layer extends from the word line decoder to the word line drive circuit in the manner of crossing one of the two divided memory arrays in the row direction.

8. The semiconductor memory device as claimed in claim 7, wherein the word line extends from the word line drive circuit to the divided memory array.

* * * * *